United States Patent [19]

Furutani et al.

[11] Patent Number: 5,397,419
[45] Date of Patent: Mar. 14, 1995

[54] THERMOSETTING IMIDE OLIGOMER AND MANUFACTURING METHOD OF HEAT RESISTANT LAMINATED SHEET USING THE SAME

[75] Inventors: Hiroyuki Furutani; Junya Ida, both of Ohtsu, Japan

[73] Assignee: Kanegafuchi Kagaku Kogyo Kabushiki Kaisha, Osaka, Japan

[21] Appl. No.: 51,683

[22] Filed: Apr. 23, 1993

[30] Foreign Application Priority Data

| Apr. 27, 1992 | [JP] | Japan | 4-135868 |
| May 22, 1992 | [JP] | Japan | 4-155987 |
| May 22, 1992 | [JP] | Japan | 4-155988 |
| Nov. 11, 1992 | [JP] | Japan | 4-327195 |
| Nov. 11, 1992 | [JP] | Japan | 4-327195 |

[51] Int. Cl.⁶ ............................................. C09J 5/02
[52] U.S. Cl. .......................... 156/307.4; 156/313; 156/331.1; 156/331.5; 528/353
[58] Field of Search .......... 156/307.4, 313, 331.1, 156/331.5; 528/353

[56] References Cited

U.S. PATENT DOCUMENTS

| 3,234,181 | 2/1966 | Oliver | 528/353 |
| 3,700,538 | 10/1972 | Kennedy | 156/313 |
| 4,075,171 | 2/1978 | D'Alelio | 528/353 |
| 4,684,714 | 8/1987 | Lubowitz et al. | 528/353 |

FOREIGN PATENT DOCUMENTS 475042 3/1992 European Pat. Off. .
WO9001522 2/1990 WIPO .

*Primary Examiner*—John J. Gallagher
*Attorney, Agent, or Firm*—Armstrong, Westerman, Hattori, McLeland & Naughton

[57] ABSTRACT

The invention discloses a thermosetting imide oligomer represented by the general formula (1A) or (1B):

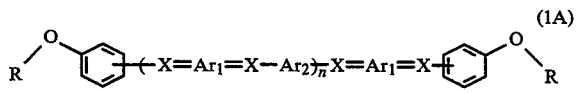

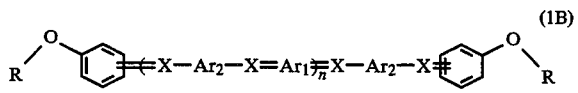

Where $Ar_1$ indicates a tetravalent aromatic group, $Ar_2$ indicates a divalent aromatic group, $Ar_1$ or $Ar_2$ can be of the same or different kind, X indicates a trivalent group and it can be of the same or different kind, n is an integer selected from 1 to 15, and R is a substitution group having reactivity.

The invention further discloses a method for manufacturing a heat resistant laminated sheet using the imide oligomer, which is excellent in heat resistance, hygroscopic resistance and electric properties.

10 Claims, No Drawings

THERMOSETTING IMIDE OLIGOMER AND MANUFACTURING METHOD OF HEAT RESISTANT LAMINATED SHEET USING THE SAME

BACKGROUND OF THE INVENTION

1. Field of the Invention

This invention relates to the novel thermosetting imide oligomer. More specifically, it relates to an imide oligomer which is able to provide a polyimide having excellent heat resistance, hygroscopic resistance, electric properties, and suitable reactivity for laminating and moulding purposes, and it also relates to a manufacturing method of a heat resistant laminated sheet having superior heat resistance, hygroscopic resistance and electric properties.

2. Description of the Prior Art

The thermosetting resins are usually used for various fields such as insulating materials and structural materials as materials for injection, impregnation, lamination and moulding. Recently, the restrictions on the use of these materials in various usages have become stricter and, particularly, the heat resistance of materials has become highly important. Conventionally, thermosetting polyimide resins and heat resistant epoxy resins have been used where the heat resistance is required.

Among these materials, there are known many thermosetting polyimide resins but "Kerimide(TM)" is often used which principally consists of a combination of a bismaleimide compound and diaminodiphenylmethane.

Recently, a both end-terminated thermosetting polyimide which uses 3-aminophenylacetylene as an amine for end-termination is on the market as "Thermid(TM)" (Hughs Air-craft, Japanese non-examined publication No. 50-5348 etc.). Although several methods are known about the synthesis of the above mentioned 3-aminophenylacetylene (for example, U.S. Pat. No. 4,125,563), there are problems that all these synthetic routes are too long and also the reagents used are expensive.

Also proposed is a both end-terminated thermosetting polyimide which uses propargyl amine as an amine for endtermination (Ube Kosan Co., Ltd. Japanese non-examined publication Nos. 2-284923, 3-174427).

In another aspect, the development of electronic equipment is remarkable and a copper laminated board used as a printed wiring board is required to have superior properties and a wider variety of usages. Particularly, as the wiring has become highly densitive due to further development of high density mounting of electronic parts, the multiplication of layers and minimization of through holes in wiring board is progressing. Consequently, good processing properties are required for the copper laminated board such as less smear occurrence in the drilling operation.

Besides the improvement in productivity and requirement of cost reduction, the processing conditions require much more strict attention in the assembling process of wiring boards, such as hot air leveler and reflow soldering. According to these requirements, much higher heat resistance and hygroscopic resistance are demanded for the copper laminated board as the substrate.

In order to satisfy these requirements, an addition curing type polyimide resin is recently utilized instead of an epoxy resin which was widely used as a laminated sheet material for the copper laminated board. Using this polyimide resin as a laminated sheet material for the copper laminated board, the remarkable advantages can be seen in that the smear in drilling operation hardly occurs and the heat resistance for processing operation and in long term tests are improved.

However, an addition curing type polyimide resin which was used in the past has the following problems. The material made by the reaction between bismaleimide and diaminodiphenylmethane is superior in use of laminated sheets, however, on the contrary, it has a problem of short time allowability for varnish and prepreg due to the high reactivity with diaminodiphenylmethane. In addition, the human toxicity of diaminodiphenylmethane is also in question. Also, there is a problem of inferior hygroscopic resistance resulting from diaminodiphenylmethane used as a curing agent and a special caution to the humidity during the long term storage is required.

The propargyl group disclosed by the Japanese non examined publication No. 2-284923 has a high thermal reaction starting temperature of 250° C., and it is known that an imide oligomer which uses the propargyl group as a reacting group is inferior in moulding properties due to the high thermosetting temperature. Moreover, it is pointed out that the polyimide resin is also generally inferior in hygroscopic resistance and may cause some trouble in the dimensional stability at the moulding process.

SUMMARY OF THE INVENTION

An object of this invention is to provide a thermosetting oligomer which provides a polyimide which is superior in heat resistance, hygroscopic resistance, and electric properties, and also which has a suitable reactivity in lamination and moulding.

Another object of this invention is to provide a heat resistant laminated sheet which is superior in heat resistance, hygroscopic resistance and electric properties.

Other objects and advantages of this invention will become apparent from the following detailed description.

The inventors of this invention have made a series of studies to attain the above objects and found out that a thermosetting oligomer having the specific structure accomplishes the above objects, thus completing this invention.

DETAILED DESCRIPTION OF THE INVENTION

This invention encompasses, in one aspect, a thermosetting imide oligomer represented by the general formulas (1A) or (1B):

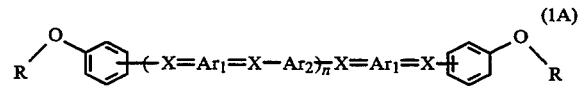

where $Ar_1$ indicates a tetravalent aromatic group, $Ar_2$ indicates a divalent aromatic group, $Ar_1$ or $Ar_2$ can be of the same or different kind, X in the formula is selected from the group consisting of trivalent groups as set forth below

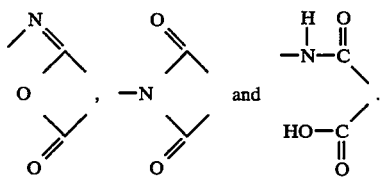

and it can be of the same or different kind, n is an integer selected from 1 to 15, and R is the reactive group —$CH_2$—C≡CH,
—$CH_2$—CH=$CH_2$,
—$CH_2$—CH=CH—$CH_3$,
—$CH_2$—$CH_2$—CH=C($CH_3$)$_2$ or
—$CH_2$—$CH_2$—CH=$CH_2$.

This invention encompasses, in another aspect, a manufacturing method of a copper laminated board which comprises:

(a) dissolving in an organic solvent a compound represented by the general formulas (1A) or (1B) to prepare a varnish resin composition, (b) coating or impregnating a reinforcing material with the varnish resin composition and drying it to a determined concentration of the residual solvent to prepare a prepreg, (c) placing one or more sheets of the prepreg in contact with a sheet of copper foil or between two sheets of copper foils, then heating and pressurizing the laminate to be one body.

At first, the manufacturing method of the thermosetting oligomer of this invention will be explained.

An acid dianhydride compound (Ar in the general formula is a tetravalent aromatic group.) represented by the general formula (2)

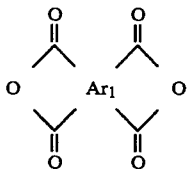

or an acid dianhydride derivative (Each of $Y_1$, $Y_2$, $Y_3$ and $Y_4$ in the general formula is hydrogen, an alkyl group selected from C1–C5, and $Ar_1$ is a terravalent aromatic group.) represented by the general formula (3)

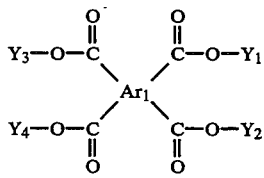

is dissolved in a polarity organic solvent in a reactor under atmosphere of a dried inert gas such as argon and nitrogen.

To this solution, an organic diamine compound represented by the general formula (4)

$$H_2N—Ar_2—NH_2 \qquad (4)$$

($Ar_2$ in the general formula is a divalent organic group) dissolved in the same polarity organic solvent as aforementioned or in a powder form is added with caution of heat generation and viscosity increase to obtain a telekeric oligomer. The temperature of this reaction is preferably from −15° to 120° C., more preferably from −15° to 100° C., and most preferably from −5° to 50° C. The reacting time is preferably from 1 to 5 hours.

To this reacted solution, a primary amine having a thermosetting group represented by the general formula (5A) is added when an imide oligomer represented by the general formula (1A) is intended, or an acid anhydride having a thermosetting group represented by the general formula (5B) is added when an imide oligomer represented by the general formula (1B) is intended, in order to terminate the ends of the above mentioned oligomer, and an oligoamic acid solution being thereby obtained.

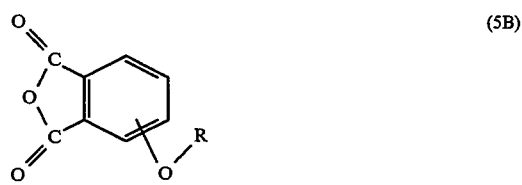

The temperature of the reaction is preferably from 0° to 120° C., more preferably from 0° to 100° C. and most preferably from 40° to 100° C. The reaction time is preferably from 1 to 5 hours.

Thereafter, a non-solvent is added to this solution for the cyclization and dehydration by heating, and this is converted to polyimide under the azeotropic and refluxing distillation. An aromatic hydrocarbon such as xylene and toluene can be used as the non-solvent in this stage, and it is preferable to use toluene. The reaction is continued until the theoretical amount of water is collected by Dean Stark reflux condenser under the azeotropic and refluxing distillation. A chemical cyclization method can also be concurrently applied. After the reaction, the polyimide solution is added to water or an alcohol-type solvent under vigorous stirring to precipitate polyimide as powder. The precipitated powder is filtrated and dried, for example, at 80° C. under reduced pressure for 48 hours.

Any organic tetracarboxylic acid dianhydride can be used for this invention, however, those represented by the general formulas (2) and (3) are preferable, in which $Ar_1$ is a tetravalent organic group and preferable to be an aromatic group. More concrete examples of $Ar_1$ are as follows:

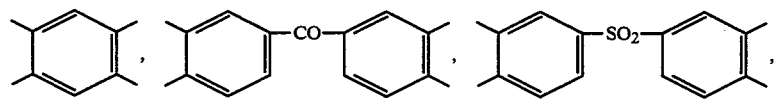

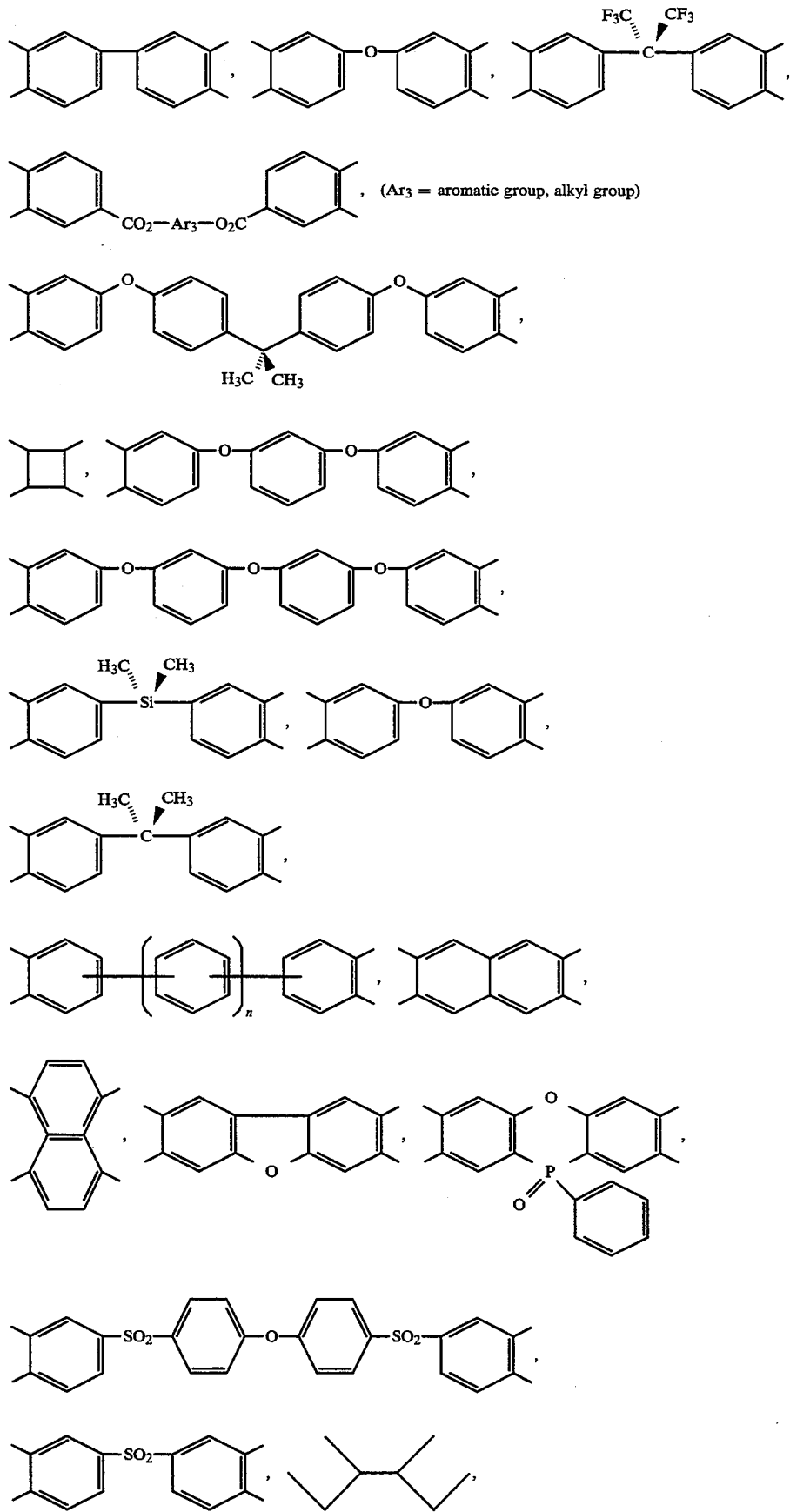

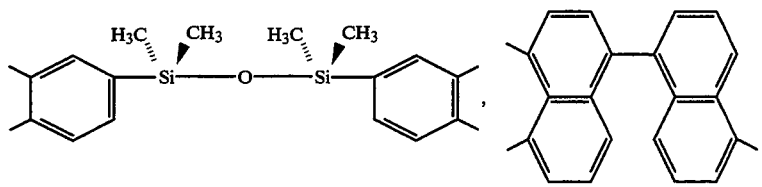

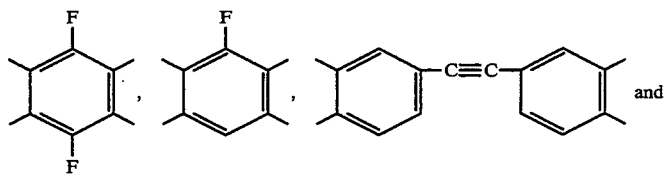

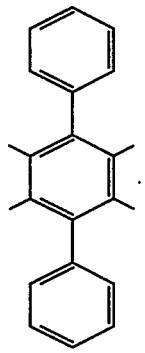

It is preferable to select as least one of those indicated below.

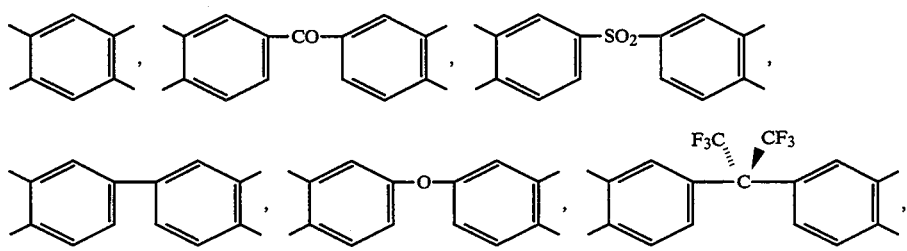

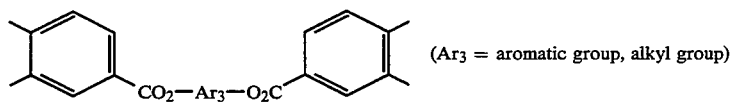

(Ar$_3$ = aromatic group, alkyl group)

and

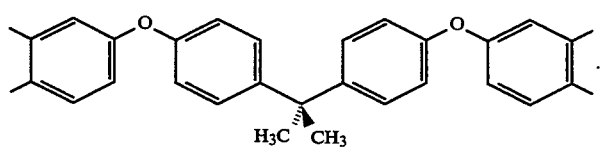

In order to acheive the intended properties more effectively, it is preferred to contain 25 to 90 mol % of bistrimellitic anhydride as set forth below:

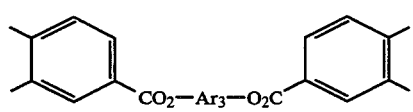

(Ar$_3$ = aromatic group, alkyl group)

In the case less than 25 mol %, low hygroscopic resistance and excellent electric properties tend to become difficult, while in the case of more than 90 mol %, control of the processing conditions tends to become difficult.

Ar$_2$ of the diamine compound represented by the general formula (4) can be essentially any bivalent organic group, and concrete example are as follows:

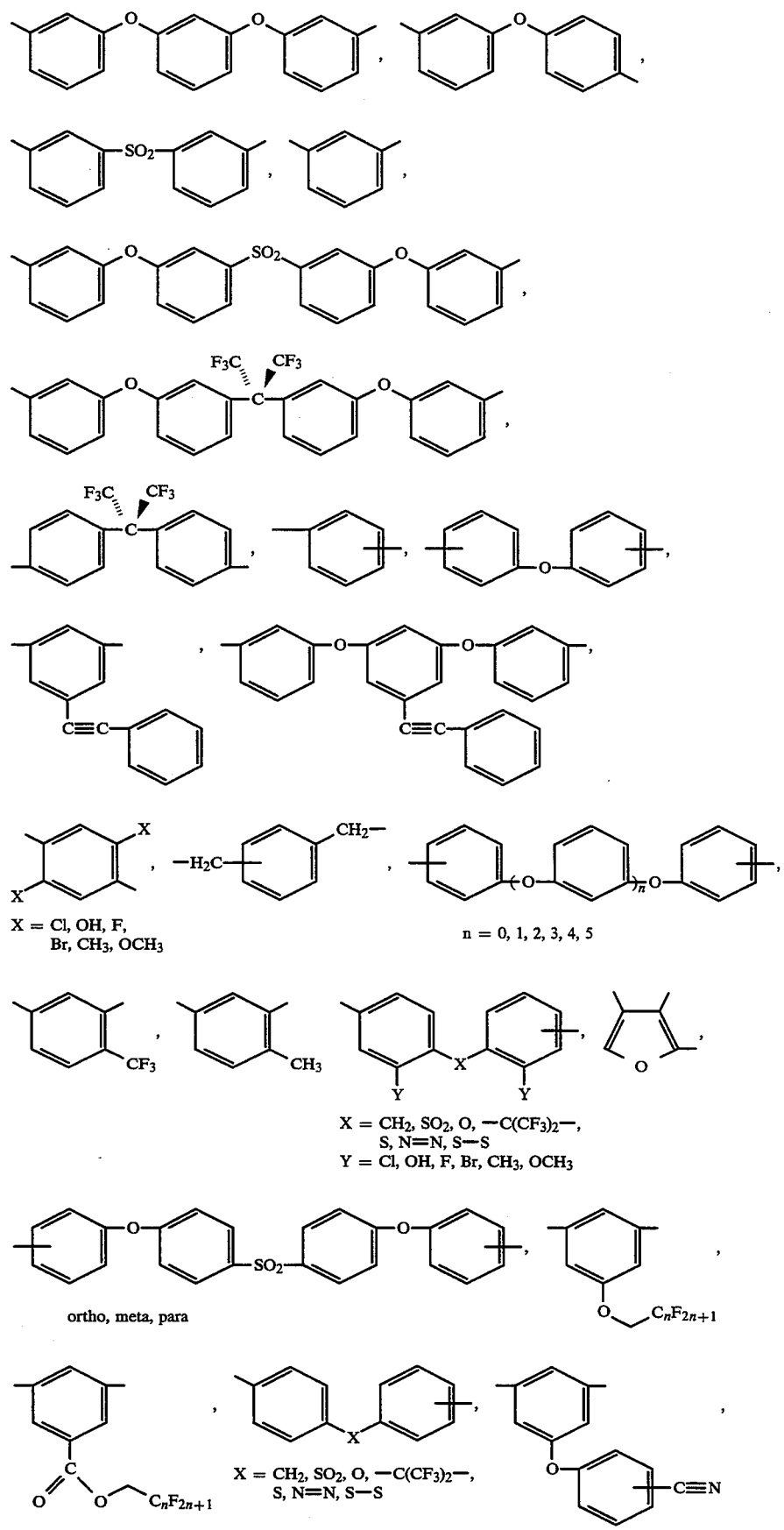

-continued
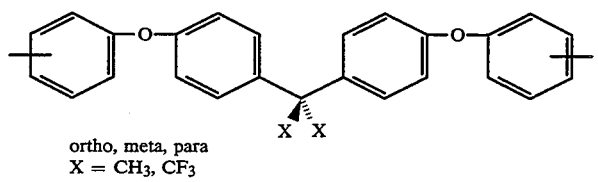
ortho, meta, para
X = CH₃, CF₃
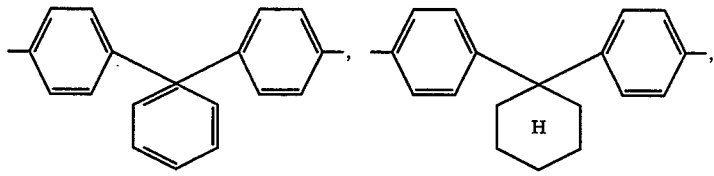
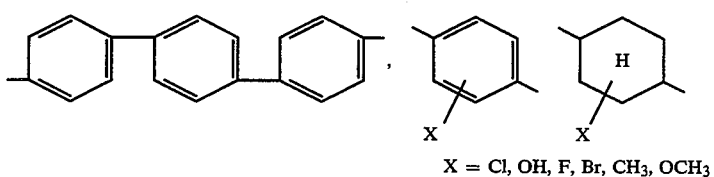
X = Cl, OH, F, Br, CH₃, OCH₃
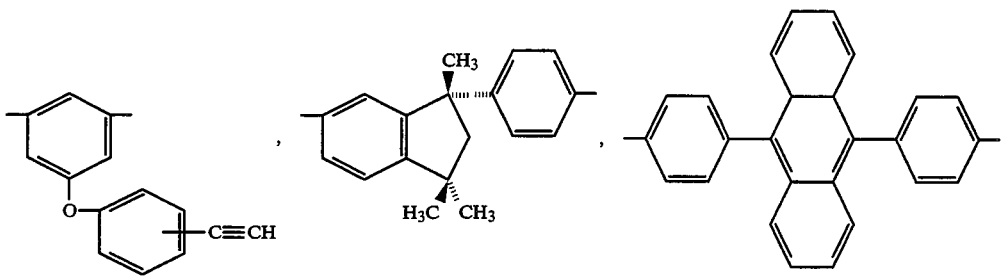
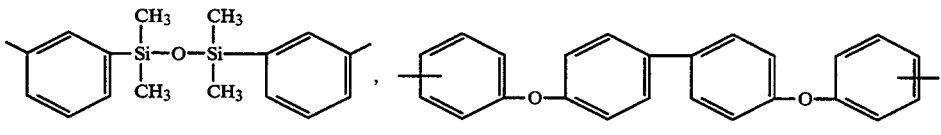
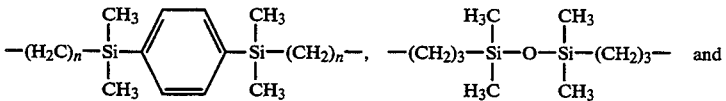
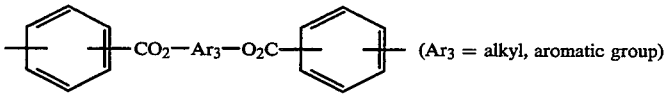 (Ar₃ = alkyl, aromatic group)
Especially, an aromatic group is preferable, and more concretely, it is preferable to contain as the main component at least one of those set forth below:
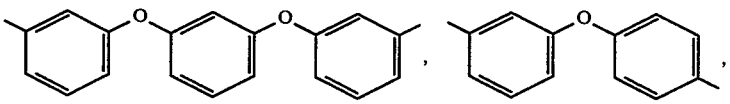
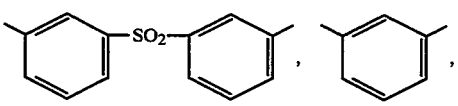

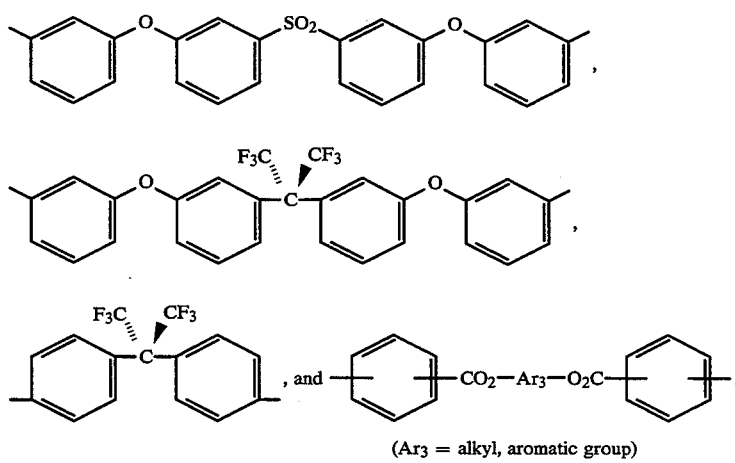

Moreover, in order to attain the intended properties more effectively, it is preferred to contain 25 to 90 mol % of bis-4-aminobenzoate as set forth below:

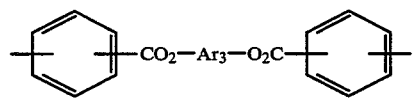

(Ar$_3$ = alkyl, aromatic group)

If it is less than 25 mol %, low hygroscopic resistance and excellent electric properties may not be expected satisfactorily, in contrast, if it is more than 90 mol %, it may be difficult to control the processing conditions.

The functional group R of the compound represented by the general formula (5A) or (5B) used in this invention to terminate the ends is exemplified as follows:
—CH$_2$—C≡CH,
—CH$_2$—CH=CH$_2$,
—CH$_2$—CH=CH—CH$_3$,
—CH$_2$—CH$_2$—CH=C(CH$_3$)$_2$ or
—CH$_2$—CH$_2$—CH=CH$_2$.

However, the following are preferable from the viewpoint of cost and handling:
—CH$_2$—C≡CH and
—CH$_2$—CH=CH$_2$.

The organic solvent used for the generating reaction of a polyamic acid solution is, for example, sulfoxides such as dimethyl sulfoxide, diethyl sulfoxide etc., formamides such as N,N'-dimethylformamide, N,N'-diethylformamide etc., and acetamides such as N,N'-dimethylacetamide, N,N'-diethylacetamide etc. These solvents can be used solely or in combination of two or more. Moreover together with these polar solvents, methanol, ethanol, isopropanol, benzene, methyl cellosolve etc. can be used, which are non-solvents to polyamic acid.

The oligomer of this invention can be also applied together with B-stage, if necessary. It is preferable to carry out B-stage at a temperature of not less than 100° C., preferably not less than 150° C. and more preferably not less than 200° C., and for not less than 1 minute, preferably not less than 5 minutes under hot air circulation or vacuum.

The diamine represented by the general formula (6) used in this invention can be synthesized, for example, by the following chemical reactions:

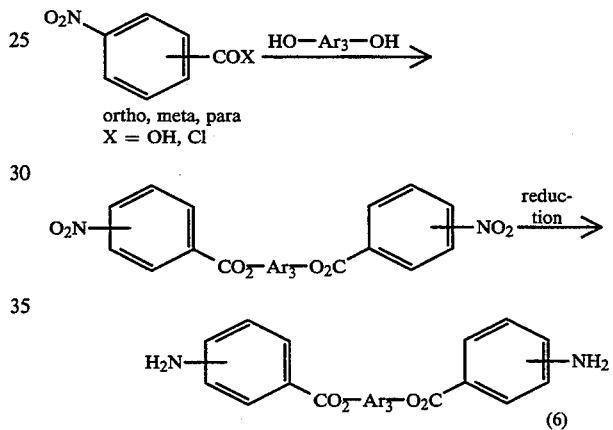

That is, nitrobenzoic acid or its derivative and a diol represented by the general formula (7)

(Ar$_3$ is a divalent aromatic group.) are reacted in the presence of a tertiary amine catalyst to obtain a dinitro compound and nitro groups of the dinitro compound are reduced to amino groups.

The acid dianhydride represented by the general formula (8) used in this invention can be synthesized, for example, by the following reaction:

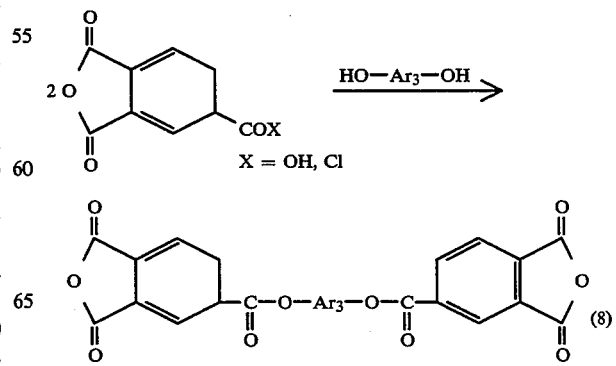

That is, trimellitic anhydride or its derivative and a diol represented by the general formula (7) are reacted in the presence of a tertiary amine catalyst.
Ar₃ of the diol represented by the general formula (7) can be essentially any divalent organic group, and concrete examples are as follows:
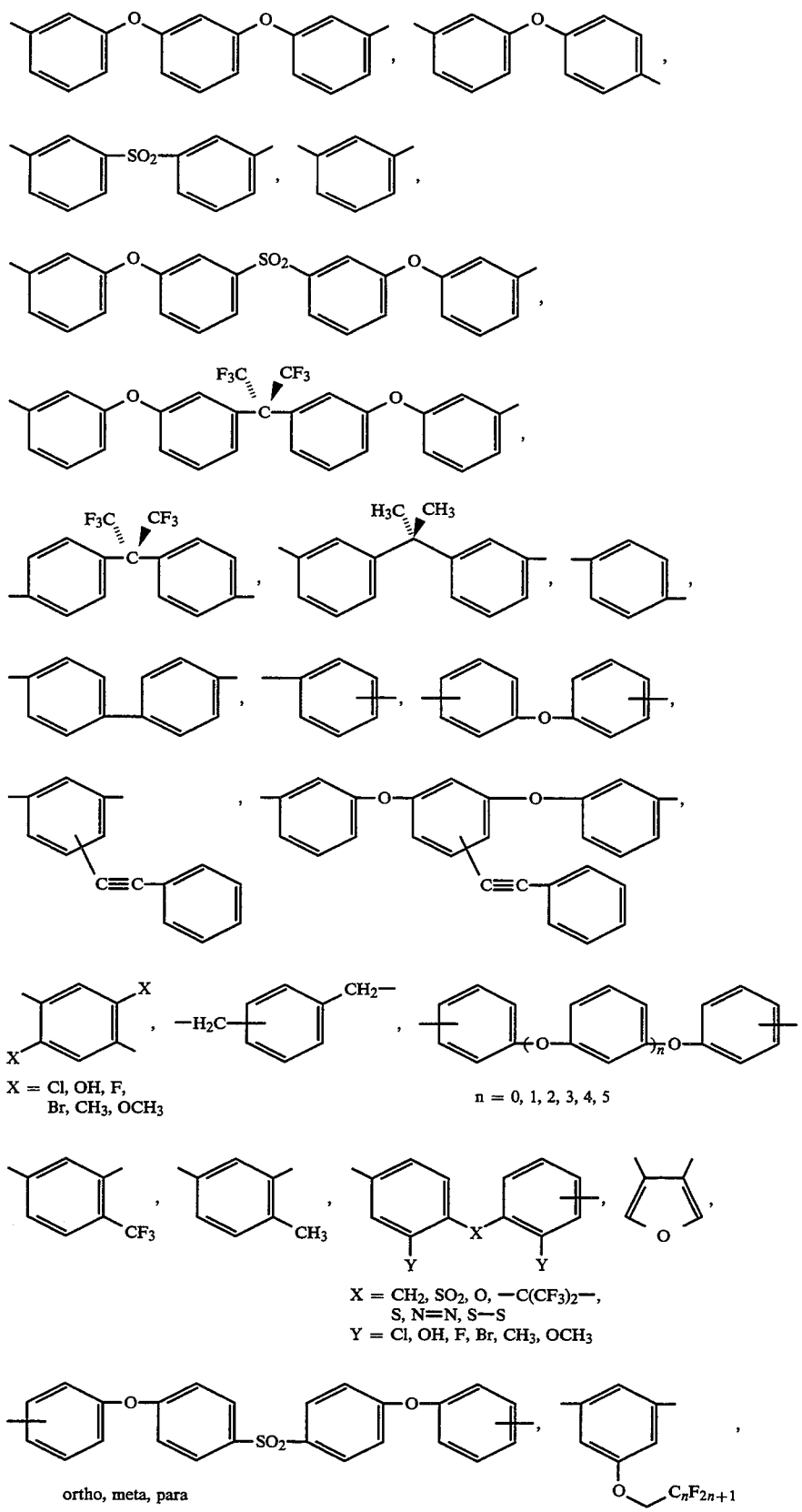

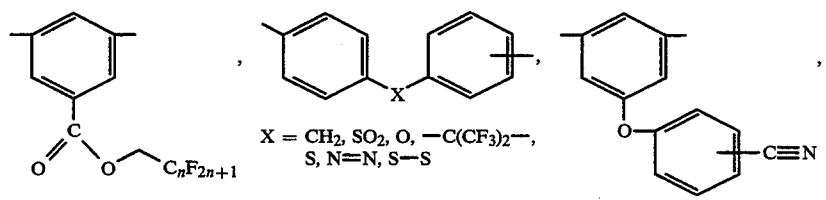
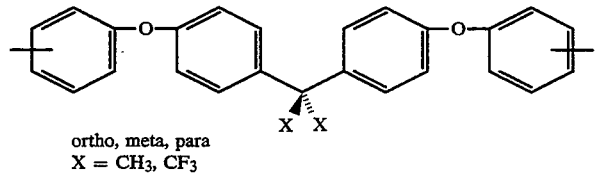
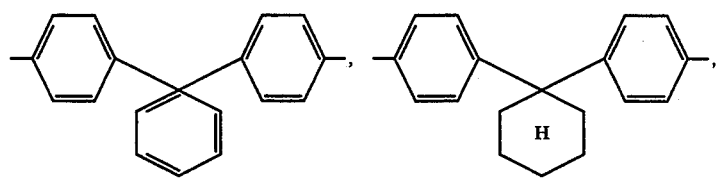
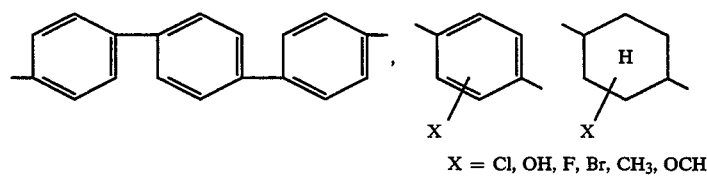
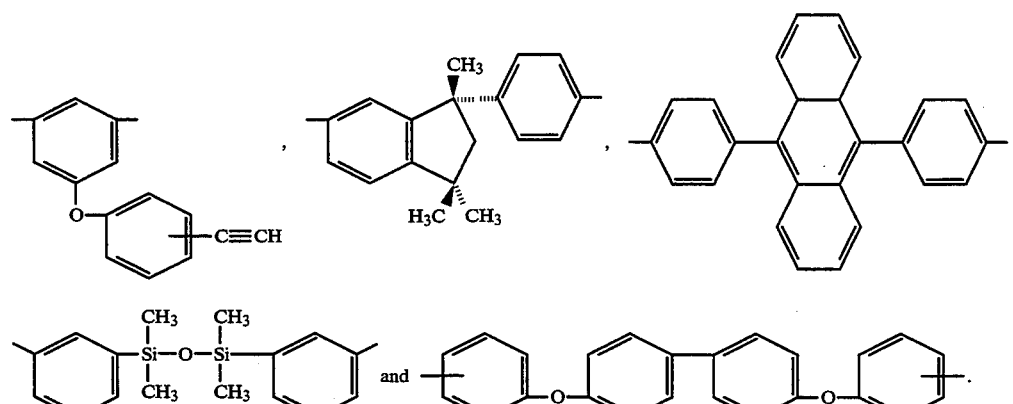
Especially, an aromatic group is preferable, and more concretely, it is preferable to contain as the main component at least one of those set forth below:
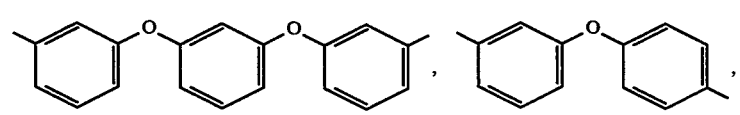
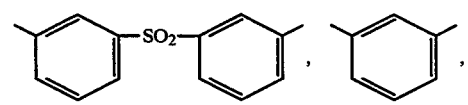
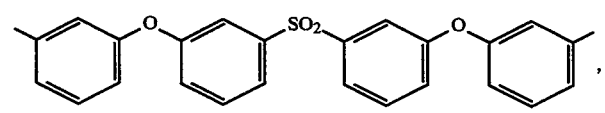

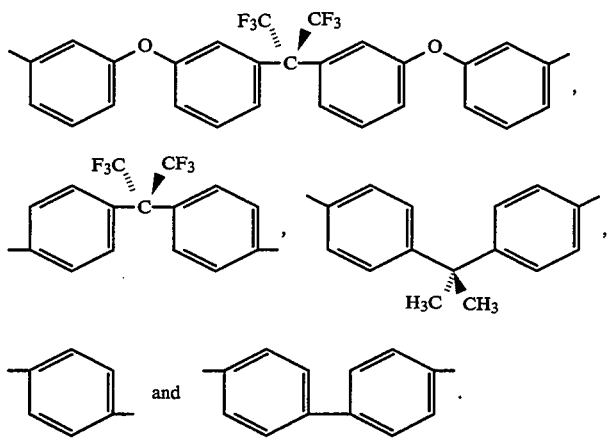

The mechanism of superior heat resistance which is exerted by the polyimide obtained by this invention is not made clear, however, it is presumably attributable to an effect of benzene skeleton formation by the thermosetting of acetylene/acetylene or an effect of polymer formation by the chromen skeleton formation/-cyclization thermosetting due to [3,3] sigmatropic rearrangement of propargyl ether (For example, 3rd International SAMPE Electric Conference page 169, 1989. Dow Chemicals: Japanese non-examined publication No. 2-85275).

In order to control the number average polymerization degree, the polymerization degree n is preferable between 0 and 30, preferably between 0 and 20, more preferably between 1 and 15. If it is too large, the solubility in an organic solvent decreases, and if it is too small, mechanical strength decreases.

To obtain a thermosetting resin from the thermosetting oligomer in this invention, epoxy resins, epoxy resin curing agents, curing accelerators, fillers, flame retardants, reinforcing agents, surface treating agents, pigments, and various kinds of elastmers, thermoplastic resins or other thermosetting oligomers can, if necessary, be used solely or in combination of two or more.

These thermosetting resins can be used in various forms and not limited by its usage. It can be used as a matrix resin for a laminated sheet intended for electrical use, namely printed wiring boards. For the use of the printed wiring board, various kinds of fillers and reinforcing agents can be used. As the fillers, aluminum hydroxide, antimony trioxide and red phosphorus are exemplified. As the reinforcing agents, carbon fiber, glass fiber, crystalline polyester fibers such as aramid fiber and Vectra(TM) fiber, cloths or non-woven cloths made of polybenzothiazole fiber and alumina fiber etc., mat and paper and combinations thereof can be used.

The imide oligomer represented by the above general formula (1A) or (1B) provides laminated sheets which are superior in heat resistance, hygroscopic resistance and electric properties.

Hereinbelow, the manufacturing method of the laminated sheet will be explained.

At first, a typical coating process is explained. The imide oligomer represented by the general formula (1A) or (1B) is dissolved in the specified amount of organic solvent according to the desired resin concentration and stirred to obtain a uniform varnish resin composition.

A reinforcing material such as glass cloth, glass non-woven cloth and glass paper etc, is coated and impregnated with the so obtained resin composition and then dried in a hot air circulating oven at a temperature from 50° to 250° C., preferably 50° to 200° C., more preferably 100° to 200° C. for the retention time set to obtain the determined concentration of a residual solvent to thus prepare a prepreg for the laminated sheet.

The organic solvents used for the above process are, for example, sulfoxides such as dimethyl sulfoxide, dimethyl sulfoxide etc., formaimides such as N,N'-diethylformamide, N,N'-diethylformamide etc., acetamides such as N,N'-dimethylacetamide, N,N'-diethylacetamide etc., ethers such as dimethyl ether, diethyl ether, dioxane etc, and ketonos such as acetone, methyl ethyl ketone etc. These polar solvents can be used together with alcohol-type solvents such as methanol, ethanol and iso-propanol.

The concentration of resin dissolved in the organic solvent is from 5 to 75% by weight, preferably 15 to 65% by weight, more preferably 35 to 65% by weight in relation to the resin concentration during the prepreg formation process. The residual solvent concentration of the prepreg is adjusted to a range of from 1 to 20% by weight, preferably 1 to 10% by weight, more preferably 1 to 5% by weight based on the resin. If the residual solvent exceeds the above range, the mechanical strength of the laminated sheet after prepreg moulding tends to lower. If the residual solvent is less than the above range, voids tend to occur due to the volatilization of the residual solvent during the prepreg moulding.

Next, the manufacturing method of the board copper laminated on both sides using the so obtained heat resistant prepreg will be explained. A cushioning materials, copper foils and prepregs are inserted between two sheets of mirror surface finished stainless steels, and those are pressurized by heating for the specified time under the specified temperature and pressure to thereby produce a one-side or both-side copper foil laminated sheet. The conjoint application of after-curing is also effective to improve the heat resistance and mechanical strength.

This invention will be explained in more detail by way of examples, however, this invention is in no way limited thereto and this invention is practicable in any variation with various amendments, improvements and modifications based on the knowledge of those skilled in the art, without any deviation from the pith and marrow of this invention.

In the following description, "%" means "% by weight" unless otherwise indicated.

Reference Example 1

Synthesis of 4-nitrophenyl-1-propargyl ether

A 500 ml three-neck flask equipped with a 200 ml dropping funnel, three-way cock and sealum cap was dried under reduced pressure and the inner air was replaced with argon. 8.0 g (0.2 mol) of sodium hydroxide dissolved in 200 ml of water was charged into the flask. Then, 27.82 g (0.2 mol) of 4-nitrophenol and 6.45 g (0.2 mol) of tetra-normal-butyl ammonium bromide were added to this solution, and 23.79 g (15.1 ml, 0.2 mol) of propargyl bromide was added over a period of 30 minutes using the dropping funnel, and the reaction was continued for 4 hours at 80° C., thereafter the content was stirred for one night at room temperature. The crystals precipitated were separated by filtration, recrystallized in toluene and 30.0 g (yield: 92.0%) of 4-nitrophenyl-1-propargyl ether was obtained.

[Values of elementary analysis] Values calculated: C;61.02, H;3.95, N;7.91. Values measured; C;59.82, H;4.04, N;7.72. [Spectrum data] IR (neat, cm$^{-1}$) $\nu$=3600-3000, 2950, 1620, 1600, 1580, 1495, 1450, 1350, 1295, 1220, 1160, 990, 905, 860, 780, 735, 690. $^1$H-NMR(chloroform-d, ppm) $\delta$=3.6(tr., 1H) 5.7(d., J=2.0 Hz, 2H), 7.1 & 8.2(dd., J=6.0 Hz, 8H)

Reference Example 2

Synthesis of 4-nitrophenyl-1-allyl ether

The same procedures as in Reference Example 1 was conducted, except that 23.79 g of propargyl bromide was changed to 24.79 g (17.1 ml, 0.2 mol) of allyl bromide, and 30.9 g (yield: 94.2%) of 4-nitrophenyl-1-allyl ether was obtained.

[Values of elementary analysis] Values calculated: C;60.34, H;5.03, N;7.82. Values measured: C;59.75, H;5.08, N;8.02. [Spectrum data] IR (neat, cm$^{-1}$) $\nu$=3600-3000, 3000, 2950, 1620, 1600, 1580, 1495, 1450, 1350, 1295, 1220, 1160, 990, 905, 860, 780, 735, 690. $^1$H-NMR(chloroform-d, ppm) $\delta$=3.8(d., J=2.0 Hz, 2H), 5.1(m., 2H), 5.9(m, 1H), 7.9(m. 4H)

Reference Example 3

Synthesis of 4-aminophenyl-1-propargyl ether

A 500 ml three-neck flask equipped with a 200 ml dropping funnel, three-way cock and sealum cap was dried under reduced pressure and the inner air was replaced by argon. Then, 26.91 g (0.61 mol) of 4-nitrophenyl-1-propargyl ether obtained by Reference Example 1 and 270 ml of dioxane were charged into the flask. Next, 260.49 g (1.16 mol) of stannic chloride and 270 ml of concentrated hydrochloric acid were added dropwise over a period of 2 hours under ice cooled condition. This reacted solution was stirred for 1 hour under ice cooled condition and added dropwise into 1 liter of a 10% sodium hydroxide aqueous solution. After filtrating tin hydroxide precipitated, the filtrate was extracted with methylene chloride. After dehydration and filtration, the solvent was evaporated to precipitate crystals, and then the crystals were filtrated and recrystallized with toluene. 20.12 g (yield: 89.2%) of 4-aminophenyl-1-propargyl ether was obtained.

[Values of elementary analysis] Values calculated: C;73.46, H;6.12, N;9.52. Values measured; C;73.85, H;5.98, N;9.86. [Spectrum data] IR (neat, cm$^{-1}$) $\nu$=3600-3000, 3000, 2950, 1620, 1600, 1580, 1495, 1450, 1350, 1295, 1220, 1160, 990, 905, 860, 780, 735, 690. $^1$H-NMR(chloroform-d, ppm) $\delta$=2.5(tr., 1H) 3.5(br. s., 2H), 4.75(d., J=1.2 Hz, 1H), 6.7(m., 4H)

Reference Example 4

Synthesis of 4-aminophenyl-1-allyl ether

The same procedures as in Reference Example 3 was conducted, except that 26.91 g (0.16 mol) of 4-nitrophenyl-1-propargyl ether was changed to 23.67 g (0.14 mol) of 4-nitrophenyl-1-allyl ether obtained by Reference Example 2, and 21.62 g (yield: 93.2%) of 4-amino-phenyl-1-allyl ether was obtained.

[Values of elementary analysis] Values calculated: C;80.74, H;5.81, N;13.45. Values measured; C;80.53, H;5.98, N;13.81. [Spectrum data] IR (neat, cm$^{-1}$) $\nu$=3600-3000, 3000, 2950, 1620, 1600, 1580, 1495, 1450, 1350, 1295, 1220, 1160, 990, 905, 860, 780, 735, 690. $^1$H-NMR(chloroform-d, ppm) $\delta$=3.5(tr., 1H) 4.2(br. s., 2H), 5.15(d., J=1.2 Hz, 1H), 6.7(m., 4H)

Reference Example 5

Synthesis of 2,2-bis (4-nitrobenzoyloxyphenyl) propane 360 ml of dried pyridine, 371 g (2 mol) of p-nitrobenzoyl chloride and 457 g (2 mol) of bisphenol A were charged into a 1-liter four-neck flask equipped with a reflux condenser, thermometer, agitator and dropping funnel, and the existing air was replaced with nitrogen gas. The reaction was continued for 3 hours under refluxing by heating, the reacted liquid was poured into 2 liters of ice cooled water, and the precipitated solid was filtrated and dried. After the recrystallization with toluene, 697 g (yield 89.6%) of 2,2-bis(4-nitrobenzoyloxyphenyl)propane ws obtained.

[Values of elementary analysis] Values calculated: C;65.37, H;4.28, N;5.45. Values measured; C;65.05, H;4.38, N;5.65.

Reference Example 6

Synthesis of 2,2-bis (4-aminobenzoyloxyphenyl) propane 148.4 g (0.25 mol) of the 2,2-bis (4-nitrobenzoyloxyphenyl) propane obtained in Reference Example 5 was dispersed in 500 ml of ethanol charged into a 1-liter four-neck flask equipped with a reflux condenser, thermometer, agitator and dropping funnel, and 2.5 g of 10% palladium supported activated charcoal was added, 66 g (1.05 mol) of hydrazine was added over a period of 30 minutes using the dropping funnel, with caution to rapid refluxing, and the refluxing was continued for 3 hours. After the reaction, the precipitate was removed and the filtrate was concentrated by an evaporator and recrystallized with ethanol. 111.5 g (yield: 86.7%) of 2,2-bis(4-aminobenzoyloxyphenyl)propane was obtained.

[Values of elementary analysis] Values calculated: C;74.01, H;5.73, N;6.17. Values measured; C;73.84, H;5.83, N;6.51.

| Analytical values | |
|---|---|
| Amine value (mgKOH/g) | Acid value (mgKOH/g) |
| 250 | 1.2 |

EXAMPLE 1

A 500 ml three-neck flask equipped with a 200 ml dropping funnel, three-way cock and sealum cap was dried under reduced pressure and the inner air was replaced with argon. 6.44 g (0.022 mol) of benzophenonetetracarboxylic acid dianhydride was charged into the flask and 150 ml of dimethylformamide (hereinafter referred as to DMF) was added. 1.47 g (0.005 mol) of 1,3-bis(3-aminophenoxy)benzene and 2.23 g (0.005 mol) of 2,2-bis(4-aminobenzoyloxyphenyl) propane obtained in Reference Example 6 were dissolved in 30 ml of DMF and added to the flask using the dropping funnel.

After stirring for 2 hours at 80° C. 2.75 g (0.02 mol) of 4-aminophenyl-1-allyl ether obtained by Reference Example 4 was dissolved in 20 ml of DMF and added. After cooling the flask at room temperature, 11 ml of acetic anhydride and 10 ml of pyridine were added to an oligo-amic acid obtained to perform dehydration and cyclization chemically, and an imide oligomer was obtained.

After the reaction, the reacted liquid was poured into 1 liter of methanol and the imide oligomer produced was precipitated. After the filtration under reduced pressure by an aspirator and drying under vacuum at 80° C. for 48 hours. 11.9 g (yield: 97.5%) of oligomer was obtained as light-yellow powder. The spectrum data of the oligomer is given below.

[Spectrum data] IR (neat, cm$^{-1}$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed.

8.3 g of the B-staged imide oligomer was pressed at 220° C. for 20 minutes, 250° C. for 30 minutes and 270° C. for 1 hour respectively under the contact pressure, and a casting plate with 1.39 g/cm$^3$ density and 12 mm (W)×12 cm (L)×3.4 mm (T) in size was obtained. The casting plate showed 58.8 kg/mm$^2$ bending strength, 315 kg/mm$^2$ bending modulus of elasticity, 35 kg.cm/cm$^2$ impact strength and the resin showed 253° C. glass transition temperature (Tg). The hygroscopic ratio (C-96/20/65) was 0.27%.

EXAMPLE 2

The same procedure as in Example 1 was carried out, except that 0.54 g (0.005 mol) of meta-phenylenediamine was used instead of 1.47 g (0.005 mol) of 1,3-bis(3-aminophenoxy)benzene and that 4-aminophenyl-1-propargyl ether obtained by Reference Example 3 was used instead of 2. 75 g (0.002 mol) of 4-aminophenyl-1-allyl ether, and an imide oligomer was obtained. The spectrum data of the oligomer is given below.

[Spectrum data] IR (neat, cm$^{-1}$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed.

8.9 g of the B-staged imide oligomer was pressed at 220° C. for 20 minutes, 250° C. for 30 minutes and 270° C. for 1 hour respectively under the contact pressure, and a casting plate with 1.36 g/cm$^3$ density and 12 mm (W)×12 cm (L)×3.8 mm (T) in size was obtained. The casting plate showed 38.8 kg/mm$^2$ bending strength, 425 kg/mm$^2$ bending modulus of elasticity, 30 kg.cm/cm$^2$ of impact strength and the resin showed 239° C. glass transition temperature (Tg). The hygroscopic ratio (C-96/20/65) was 0.18%.

EXAMPLE 3

The same procedure as in Example 1 was carried out, except that 1.06 g (0.005 mol) of diaminobenzophenone was used instead of 1.47 g (0.005 mol) of 1,3-bis(3-aminophenoxy)benzene and that 2.75 g (0.02 mol) of 4-aminophenyl-1-propargyl ether obtained by Reference Example 3 was used instead of 4-aminophenyl-1-allyl ether, and an imide oligomer was obtained. The spectrum data of the oligomer is given below.

[Spectrum data] IR (neat, cm$^{-1}$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed. 7.5 g of the B-staged imide oligomer was pressed at 220° C. for 20 minutes, 250° C. for 30 minutes and 270° C. for 1 hour respectively under the contact pressure, and a casting plate with 1.37 g/cm$^3$ density and 12 mm (W)×12 cm (L)×3.2 mm (T) in size was obtained. The casting plate showed 46.8 kg/mm$^2$ bending strength, 315 kg/mm$^2$ bending modulus of elasticity, 22 kg.cm/cm$^2$ of impact strength and the resin showed 248° C. glass transition temperature (Tg). The hygroscopic ratio (C-96/20/65) was 0.23%.

Reference Example 7

Synthesis of 3-propargyl-oxyphthalic acid anhydride 12.5 g (0.051 mol) of bromophthalic acid (product of Bromochem. Co. Ltd.) and 8.0 g (0.2 mol) of sodium hyroxide dissolved in 200 ml of water were charged into a reactor. After adding 6.45 g (0.2 mol) of tetra-n-butyl-ammonium bromide, 2.79 g (0.050 mol) of propargyl alcohol was added over a period of about 30 minutes using the dropping funnel, and the reaction was continued for 4 hours at 80° C. and thereafter being stirred overnight at room temperature. The crystals formed were filtrated, recrystallized with toluene and 10.5 g (yield: 94.2%) of propargyl ether was obtained. The crystals obtained and 100 ml of o-toluene were charged into the reactor replaced with nitrogen gas and the content was refluxed for 12 hours. The crystals precipitated were filtrated under heating and purified by the sublimation, and 5.8 g of 3-propargyl oxyphthalic acid anhydride was obtained.

[Values of elementary analysis] Values calculated: C;65.35, H;2.99. Values measured; C;64.99, H;3.12. [Spectrum data] IR (neat, cm$^{-1}$) $\nu$=3000, 2950, 1620, 1600, 1580, 1495, 1450, 1350, 1220, 1160, 990, 905, 860, 780, 690. $^1$H-NMR(chloroform-d, ppm) $\delta$=3.5(d., J=2.4 Hz, 1H) 5.15(d., J=2.4 Hz, 2H), 6.7(m., 3H)

Reference Example 8

Synthesis of bisphenol A bistrimellitate

A 500-ml three-neck flask equipped with a sealum cap, three-way cock, Dimroth condenser and dropping funnel was dried and the inner air was replaced with nitrogen gas, then 42.11 g of trimellitic acid chloride (TMA-Cl) and dried toluene were charged into the flask. The flask was heated up to 100° C. in an oil bath to dissolve trimellitic acid chloride. 18.6 g of bisphenol A was dissolved in 42.4 ml of dried pyridine and 30 ml of dried toluene and then charged into the flask over a period of 15 minutes using the dropping funnel, to thus cause the reaction to proceed for 1 hour. Then, the reaction was further continued for 2 hours under refluxing.

After the completion of the reaction, the flask was cooled sufficiently and the mixture of precipitated pyridinium-hydrochloride and acid dianhydride was filtrated by suction. The filtrated white solid was heated in acetic anhydride to dissolve pyridium-hydrochloride and insuluble acid dianhydride was filtrated by suction rapidly. The same operation was further repeated twice. After drying under reduced pressure at 80° C. for 24 hours by the use of a vacuum dryer, 42.01 g (yield: 78.6%) of acid dianhydride was obtained as white crystals. The melting point was 195.9° C.

EXAMPLE 4

A 500-ml three-neck flask equipped with a 200-ml dropping funnel, three-way cock and sealum cap was dried under reduced pressure and the inner air was replaced with argon. 3.22 g (0.02005 mol) of benzophehone tetracarboxylic acid dianhydride was charged into the flask and 150 ml of DMF was added. 1.46 g (0.005 mol) of 1,3-bis(3-aminophenoxy)benzene and 2.23 g (0.005 mol) of 2,2-bis(4-aminobenzoyloxyphenyl)propane obtained by Reference Example 6 were dissolved in 30 ml of DMF and then added to the reactor using the dropping funnel.

After stirring at 80° C. for 2 hours, 1.57 g (0.01 mol) of 3-propargyloxyphthalic acid anhydride obtained by Reference Example 7 was dissolved in 20 ml of DMF and added. After cooling the reactor to room temperature, 11 ml of acetic anhydride and 10 ml of pyridine were added to conduct dehydration and cyclization chemically and an imide oligomer was obtained.

After the reaction, the reacted liquid was poured into 1 liter of methanol and the imide oligomer produced was precipitated. After the filtration under reduced pressure using an aspirator and drying under vacuum at 80° C. for 48 hours, 7.95 g (yield: 91.5%) of oligomer was obtained as light-yellow powder. The spectrum data of the oligomer is given below.

[Spectrum data] IR (neat, cm$^{-1}$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed. 6.8 g of this B-staged imide oligomer was pressed at 220° C. for 20 minutes, 250° C. for 30 minutes and 270° C. for 1 hour respectively under the contact pressure, and a casting plate with 1.39 g/cm$^3$ density and 12 mm (W)×12 cm (L)×3.2 mm (T) in size was obtained. The casting plate showed 42.6 kg/mm$^2$ bending strength, 315 kg/mm$^2$ bending modulus of elasticity, 35 kg.cm/cm$^2$ impact strength and the resin showed 253° C. glass transition temperature (Tg). The hygroscopic ratio (C-96/20/65) was 0.25%.

EXAMPLE 5

A 500 ml three-neck flask equipped with a 200 ml dropping funnel, three-way cock and sealum cap was dried under reduced pressure and the inner air was replaced with argon. 5.77 g (0.01 mol) of bisphenol A bistrimellitate dianhydride obtained by Reference Example 8 and 6.44 g (0.02 mol) of benzophenone tetracarboxylic acid dianhydride were charged into the flask and 200 ml of DMF was added. 4.39 g (0.015 mol) of 1,3-bis(3-aminophenoxy)benzene was dissolved in 50 ml of DMF and then added dropwise to the reactor using the dropping funnel.

After stirring at 80° C. for 2 hours. 4.12 g (0.03 mol) of 4-aminophenyl-1-allyl ether was dissolved in 15 ml of DMF and added. After cooling the reactor to room temperature, 11 ml of acetic anhydride and 10 ml of pyridine were added to conduct dehydration and cyclization chemically.

After the reaction, the reacted liquid was poured into 1 liter of methanol and the imide oligomer produced was precipitated. After the filtration under reduced pressure using an aspirator and drying under vacuum at 80° C. for 48 hours, 18.9 g (yield: 91.5%) of oligomer was obtained as light-yellow powder. The spectrum data of the oligomer is given below.

[Spectrum data] IR (neat, cm$^{-1}$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed. 7.4 g of this B-staged imide oligomer was pressed at 220° C. for 20 minutes. 250° C. for 30 minutes and 270° C. for 1 hour respectively under the contact pressure, and a casting plate with 1.41 g/cm$^3$ density and 12 mm (W)×12 cm (L)×3.2 mm (T) in size was obtained. The casting plate showed 56.2 kg/mm$^2$ bending strength, 295 kg/mm$^2$ bending modulus of elasticity, 31 kg.cm/cm$^2$ impact strength and the resin showed 231° C. glass transition temperature (Tg). The hygroscopic ratio (C-96/20/65) was 0.19%.

EXAMPLE 6

The same procedure as in Example 5 was carried out, except that 1.62 g (0.015 mol) of meta-phenylenediamine was used instead of 4.39 g (0.015 mol) of 1,3-bis(3-aminophenoxy)benzene, and an imide oligomer was obtained. The spectrum data of the oligomer is given below.

[Spectrum data] IR (neat, cm$^-$) $\nu$=3000, 2950, 1780, 1750, 1700, 1620, 1600, 1580, 1495, 1450, 1350, 1295, 1220, 1160, 990, 905, 860, 780, 735, 690.

This oligomer was melted and defoamed in a vacuum oven at 220° C. to perform B-staging and reddish brown powder was formed. 8.3 g of this B-staged imide oligomer was pressed at 220° C. for 20 minutes, 250° C. for 30 minutes and 270° C. for 1 hour respectively under the contact pressure, and a casting plate with 1.39 g/cm$^3$ density and 12 mm (W)×12 cm (L)×3.4 mm (T) in size was obtained. The casting plate showed 58.8 kg/mm$^2$ bending strength, 315 kg/mm$^2$ bending modulus of elasticity, 35 kg.cm/cm$^2$ impact strength and the resin showed 253° C. glass transition temperature (Tg). The hygroscopic ratio (C-96/20/65) was 0.27%.

Comparative Example 1

9.2 g of an imide type thermosetting oligomer "Kerimide" (Nihon Polyimide Co., Ltd.) available on the market was pressed at 220° C. for 20 minutes, 250° C. for 30 minutes and 270° C. for 1 hour respectively, under the contact pressure, and a casting plate with 1.35 g/cm$^3$ density and 12 mm (W)×12 cm (L)×3.5 mm (T) in size was obtained. The casting plate showed 38.2 kg/mm$^2$ bending strength, 261 kg/mm$^2$ bending modulus of elasticity, 18 kg.cm/cm$^2$ impact strength and 212° C. glass transition temperature (Tg). The hygroscopic ratio (C-96/20/65) was 0.75%.

EXAMPLE 7

A 500 ml three-neck flask equipped with a three-way cock, Dean Stark distillator, Dimroth reflux condenser and sealum cap was dried under reduced pressure. 21.93 g (75 mmol) of 1,3-bis(3-aminophenoxy)benzene was charged into the flask and the inner air was fully replaced with nitrogen gas, and subsequently, 15 ml of dried DMF was added and ice cooled. Next, 28.83 g (50 mmol) of acid dianhydride represented by the formula (9)

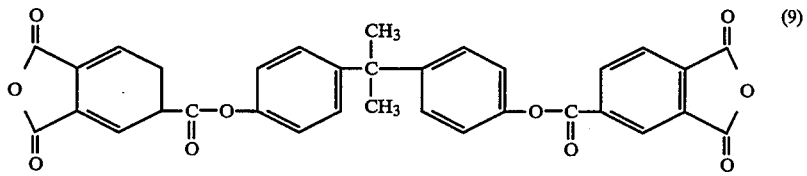

and 32.22 g (100 mmol) of 3,3'4,4'-benzophenone tetracarboxylic acid dianhydride were dissolved in 80 ml of DMF and then charged into the dropping funnel. This solution was added to the reaction system at once with caution to heat generation and the reaction was continued for 1 hour at 0° C. and 0.5 hour at 80° C.

Next, 22.08 g (150 mmol) of 4-aminophenyl-1-propargyl ether dissolved in 20 ml of DMF was added and caused to react for 1 hour. Thereafter, 200 ml of toluene was added and 5.5 ml (theoretically 5.4 ml) of reacted water was removed under azeotropic boiling at 150° C. (temperature of water bath) to thus conduct dehydration and cyclization. After the reaction, the reacted liquid was poured into 1.5 liter of methanol and the generated imide oligomer was precipitated. The prerecipitate was filtrated under reduced pressure and dried at 80° C. under vacuum for 48 hours, and 98.1 g (yield: 98.4%) of oligomer was obtained as light-yellow powder. The spectrum data of the oligomer is given below.

[Spectrum data] IR (neat, cm$^{-1}$) $\nu$=3000, 2950, 1780, 1750, 1700, 1630, 1600, 1580, 1495, 1440, 1350, 1295, 1220, 1160, 990, 910, 860, 780, 735, 690.

100 g of this imide oligomer was dissolved in 100 g of DMF (resin concentration: 50%/DMF) and with this solution 8 sheets of 20×20 cm glass cloth (WEA-18W 7628: Nitto Boseki Co., Ltd.) were impregnated. They were dried at 150° C. for 120 minutes in a hot air circulating oven and prepregs having the resin concentration of 45% (per 1 sheet of glass cloth) and the residual solvent concentration of 4.2% were prepared.

These 8 sheets of prepregs were interposed between two sheets of electrolyzed copper foils (18 μm, Furukawa Electric Co., Ltd.) and moulded into an integrated body at 200° C. for 2 hours under 40 kg/cm$^2$ pressure, and a 1.62 mm-thick board copper laminated on both sides was obtained.

EXAMPLE 8

The same procedure as in Example 7 was carried out, except that 31.39 g (75 mmol) of 2,2-bis[4-(4-aminophenoxy)phenyl]propane was used instead of 21.93 g (75 mmol) of 1,3-bis(3-aminophenoxy)benzene, and 104.2 g (yield: 95.5%) of imide oligomer was obtained. The spectrum data of the oligomer is given below.

[Spectrum data] IR (neat, cm$^{-1}$) $\nu$=3500, 3300, 2940, 1780, 1720, 1650, 1590, 1520, 1480, 1380, 1240, 1190, 1100, 1020, 980, 930, 810, 720.

Using 100 g of this oligomer, a 1.6 mm-thick board copper laminated on both sides was obtained under the same conditions as in Example 7.

Comparative example 2

100 g of the imide type thermosetting oligomer "Kerimide" available on the market was dissolved in 100 g of DMF (resin concentration: 50%/DMF). With this solution was impregnated 8 sheets of 20×20 cm glass cloth (WEA-18W 7628; Nitto Boseki Co., Ltd.).

They were dried at 150° C. for 120 minutes in a hot air circulating oven and prepregs having the resin concentration of 45% (per 1 sheet of glass cloth) and the residual solvent concentration of 4.2% were obtained. These 8 sheets of prepregs were interposed between two sheets of electrolyzed copper foils (18 μm, Furukawa Electric Co., Ltd.) and moulded into an integrated body at 200° C. for 2 hours undef 40 kg/cm$^2$ pressure, and a 1.63 mm-thick board copper laminated board on both sides was obtained.

The physical properties of the above copper laminated boards obtained by Examples 7 and 8 and Comparative Example 2 are shown in Table 1.

TABLE 1

| | Copper foil[*1] Peel Strength (kgf/cm) | Glass[*2] Transition temperature Tg (°C.) | Bending[*3] strength (kgf/cm$^2$) | Heat resistance of soft solder | |
|---|---|---|---|---|---|
| | | | | 260° C. 30 sec[*4] | PCT[*5] |
| Example 7 | 1.2 | 285 | 55 | ◯ | ◯ |
| Example 8 | 1.4 | 290 | 52 | ◯ | ◯ |
| Comparative Example 2 | 0.8 | 273 | 40 | ◯ | X |

[Notes]
[*1]JIS-C 6481
[*2]Measured by SDM5600H DMS110 of Seiko Electronic Co., Ltd.
[*3]JIS method
[*4]After dipping in a soft solder bath (260° C., 30 sec.), blister was observed according to the following criteria; ◯: Good (no blister), X: Bad (with blister).
[*5]Pressure cooker test; After the treatment under 121° C., 2 atmospheric pressure for 5 hours, and then dipping in a soft solder bath (260° C., 30 sec.), blister was observed according to the following criteria; ◯: Good (no blister), X: Bad (with blister).

EXAMPLE 9

A 500-ml three-neck flask equipped with a three-way cock, Dean Stark distillator, Dimroth reflux condenser and sealum cap was dried under the reduced pressure. 43.85 g (150 mmol) of 1,3-bis(3-aminophenoxy)benzene was charged and the air was fully replaced with nitrogen gas, and subsequently 30 ml of DMF dried was added and ice cooled.

Next, a mixture of 14.41 g (25 mmol) of the acid deanhydride represented by the above formula (9) and 16.11 g (50 mmol) of 3,3',4,4'd-benzophenone tetracarboxylic acid dianhydride was dissolved in 60 ml of DMF were charged into the dropping funnel. This solution was added to the reaction mixture at once with caution of heat generation and reacted for 1 hour at 0° C. and 0.5 hour at 80° C. Next, 33.33 g (150 mmol) of 3-propargyl oxyphtalic acid anhydride dissolved in 15 ml of DMF was added and caused to react for 1 hour. Thereafter, 200 ml of toluene was added and 5.5 ml (theoretically 5.4ml) of reacted water was removed under the azeotropic boiling at 150° C. (temperature of water bath) to thus conduct dehydration and cyclization, and thus an imide oligomer was obtained. After the reaction, the reacted liquid was poured into 1.5 liters of methanol and the imide oligomer formed was precipitated. The crystals precipitated were filtrated under reduced pressure and dried at 80° C. for 48 hours, and 92.4 g (yield: 93.1%) of oligomer was obtained as light-yellow powder. The spectrum data of the oligomer is given below.

[Spectrum data] IR (neat, cm$^{-1}$) $\nu$=3000, 2950, 1780, 1750, 1700, 1630, 1600, 1580, 1495, 1440, 1350, 1295, 1220, 1160, 990, 910, 860, 780, 735, 690.

100 g of this imide oligomer was dissolved in 100 g of DMF (resin concentration: 50%/DMF) and with this solution were impregnated 8 sheets of 20×20 cm glass cloth (WEA-18W 7628; Nitto Boseki Co., Ltd.). They were dried at 150° C. for 120 minutes in a hot air circulating oven and prepregs having the resin concentration of 45% (per 1 sheet of glass cloth) and the residual solvent concentration of 4.2% were produced.

These 8 sheets of prepregs were interposed between two electrolyzed copper foils (18 $\mu$m, Furukawa Electric Co., Ltd.) and moulded into an integrated body at 200° C. for 2 hours under 40 kg/cm$^2$ pressure, and thus a 1.62 mm-thick board copper laminated on both sides was obtained.

EXAMPLE 10

The same procedure as in Example 9 was carried out, except that 62.79 g (150 mmol) of 2,2-bis[4-(4-aminophenoxy)phenyl]propane was used instead of 43.85 g (150 mmol) of 1,3-bis(3-aminophenoxy)benzene, and 115.6 g (yield: 97.8%) of imide oligomer was obtained. The spectrum date of the oligomer is given below.

[Spectrum data] IR (neat, cm$^{-1}$) $\nu$=3200, 3030, 2950, 1780, 1750, 1700, 1630, 1600, 1580, 1495, 1450, 1350, 1295, 1220, 1160, 990, 905, 860, 780, 735, 690.

Using 100 g of this oligomer, a 1.6 mm-thick board copper laminated on both sides was obtained under the same conditions as in Example 9.

The physical properties of the above mentioned copper laminated boards obtained by the Examples 9 and 10 and, for comparison, those of the board obtained by Comparative Example 2 are shown in Table 2.

TABLE 2

| | Copper foil[*1] Peel Strength (kgf/cm) | Glass[*2] Transition temperature Tg (°C.) | Bending[*3] strength (kgf/cm$^2$) | Heat resistance of soft solder | |
|---|---|---|---|---|---|
| | | | | 260° C. 30 sec[*4] | PCT[*5] |
| Example 9 | 1.2 | 280 | 53 | ○ | ○ |
| Example 10 | 1.2 | 289 | 56 | ○ | ○ |
| Comparative Example 2 | 0.8 | 273 | 40 | ○ | X |

[Notes]
[*1]JIS-C 6481
[*2]Measured by SDM5600H DMS110 of Seiko Electronic Co., Ltd.
[*3]JIS method
[*4]After dipping in a soft solder bath (260° C., 30 sec.), blister was observed according to the following criteria; ○: Good (no blister), X: Bad (with blister).
[*5]Pressure cooker test; After the treatment under 121° C., 2 atmospheric pressure for 5 hours, and then dipping in a soft solder bath (260° C., 30 sec.), blister was observed according to the following criteria; ○: Good (no blister), X: Bad (with blister).

The termosetting oligomer having a reactive property related to this inventin is able to provide thermosetting compositions which are superior in hygoscopic resistance and processability and which also have the higher heat resistance property than ever seen.

Furthermore, the thermosetting oligomer having a reactive property obtained by this invention is able to provide a polyimide superior in mechanical strength, dimensional stability and electric properties, specially with less occurrence of voids and cracks in the finished moulded products.

As mentioned above, the oligomer of this invention which has a reactive property is able to provide materials having an extremely high industrial value in the wide usage of high polymer materials for the laminated sheets, heat resistant paints and electronic devices, and moulding materials or the like.

The laminated sheets obtained by using the thermosetting oligomer of this invention are superior in the heat resistance, hygroscopic resistance and electric properties.

What is claimed is:

1. A thermosetting imide oligomer of the formula

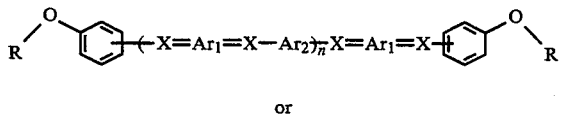

or

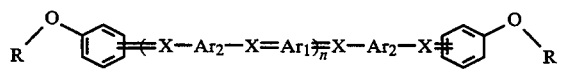

wherein Ar$_1$ is a tetravalent aromatic group, Ar$_2$ is a divalent aromatic group, each X is

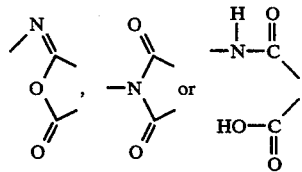

n is an integer from 1 to 15, and R is
—CH$_2$—C≡CH,
—CH$_2$—CH=CH$_2$,
—CH$_2$—CH=CH—CH$_3$,
—CH$_2$—CH$_2$—CH=C(CH$_3$)$_2$ or
—CH$_2$—CH$_2$—CH=CH$_2$.

2. A thermosetting imide oligomer according to claim 1, wherein the formula is

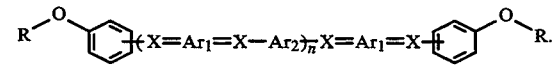

3. A thermosetting imide oligomer according to claim 1, wherein the formula is

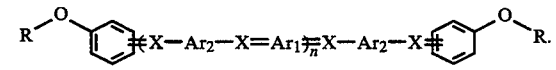

4. A thermosetting imide oligomer according to claim 1, wherein from 25 to 90 mol % of Ar$_1$ has the structure

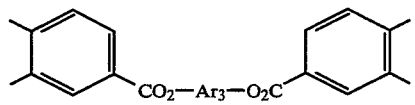
5. A thermosetting imide oligomer according to claim 2, wherein from 25 mol % to 90 mol % of $Ar_2$ has the structure
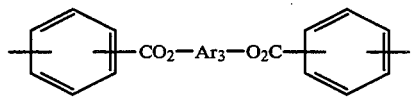
wherein $Ar_3$ is a divalent alkyl or aromatic group.
6. A thermosetting imide oligomer of claim 4, wherein $Ar_3$ is
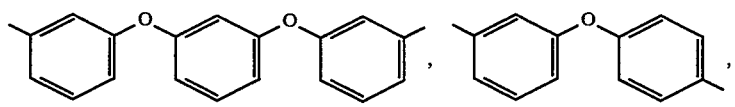
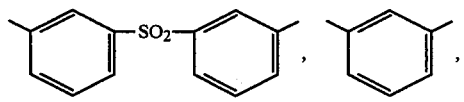
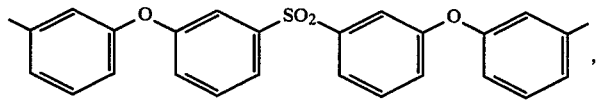
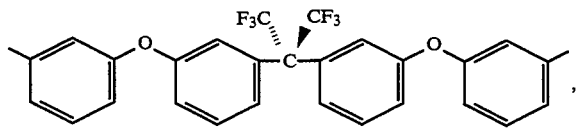
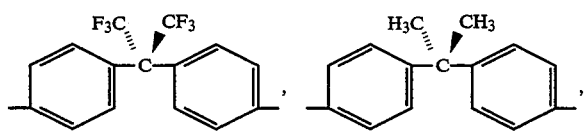
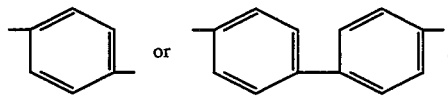
7. A thermosetting imide oligomer of claim 5, wherein $Ar_3$ is
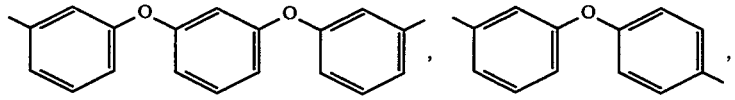
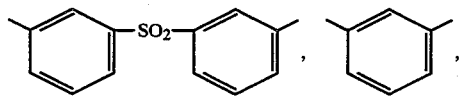
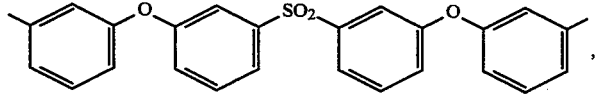
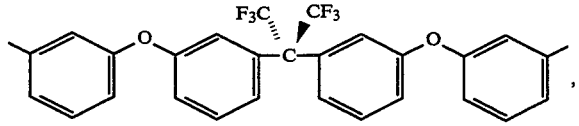

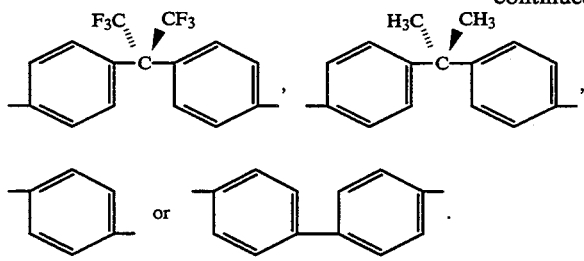

8. A method for manufacturing a copper laminated board which comprises:
(a) dissolving a thermosetting imide oligomer according to claim 1 in an organic solvent to prepare a varnish resin composition,
(b) coating or impregnating a reinforcing material with the varnish resin composition and drying it to a determined concentration of the residual solvent to prepare a prepreg,
(c) placing one or more sheets of the prepreg in contact with a sheet of copper foil or between two sheets of copper foil to form a laminate, and
(d) applying heat and pressure to the laminate to form the board.

9. A method for manufacturing a copper laminated board according to claim 8, wherein the varnish resin composition contains 5 to 75% by weight of the thermosetting imide oligomer.

10. A method for manufacturing a copper laminated board according to claim 9, wherein the prepreg contains from 1 to 20% of the solvent based on the weight of the varnish resin composition.

* * * * *